March 1, 1960 K. S. VOGT ET AL 2,927,281
PUSH-PULL TRANSISTOR OSCILLATOR
Filed Jan. 17, 1956
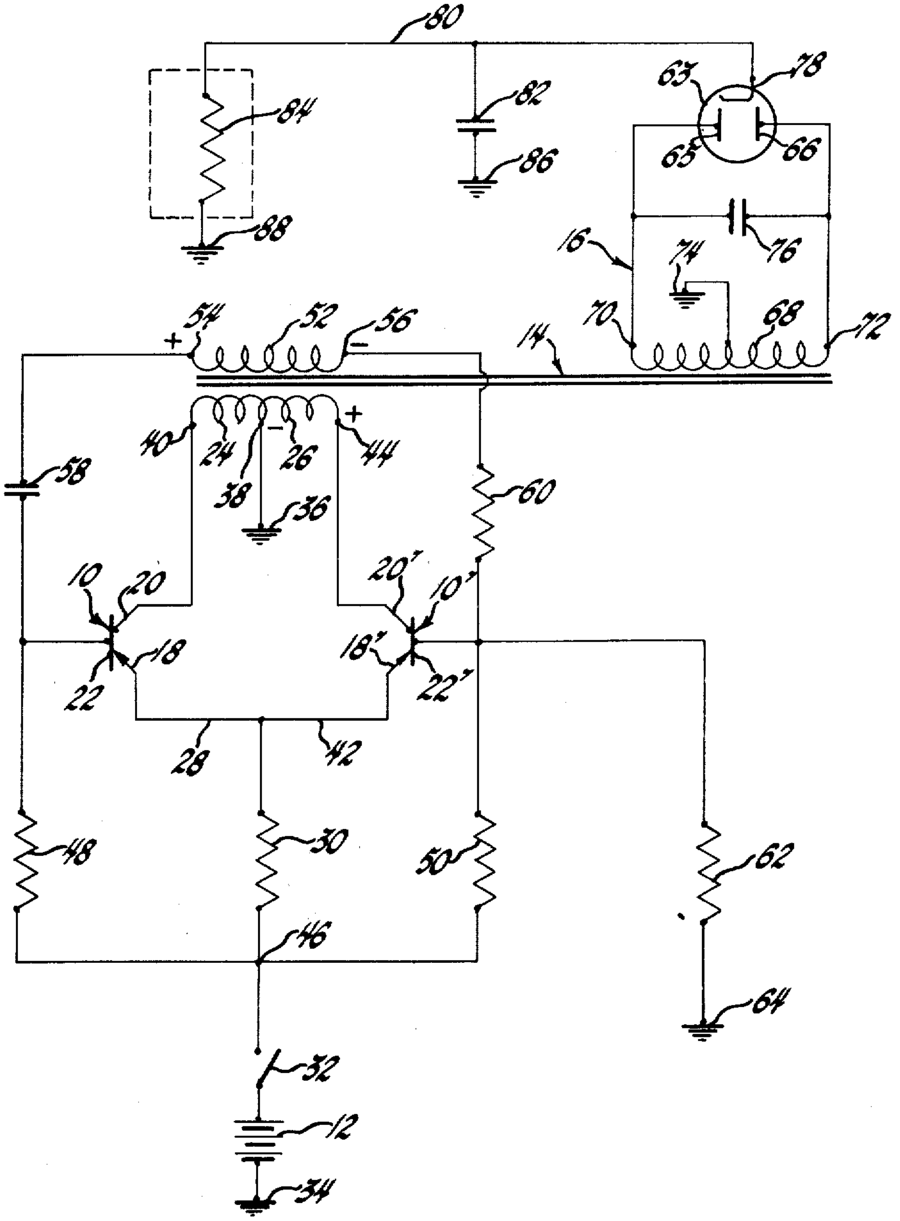
INVENTOR.
Kenneth S. Vogt &
BY Leslie E. Scott
E. W. Christen
ATTORNEY United States Patent Office 2,927,281

Patented Mar. 1, 1960

2,927,281

PUSH-PULL TRANSISTOR OSCILLATOR

Kenneth S. Vogt and Leslie E. Scott, Kokomo, Ind., assignors to General Motors Corporation, Detroit, Mich., a corporation of Delaware Application January 17, 1956, Serial No. 559,555

2 Claims. (Cl. 331—62)

This invention relates to transistor oscillator circuits and more particularly to feedback oscillators of the blocking type connected in push-pull arrangement.

In utilizing a transistor oscillator as a power supply, such as the plate voltage supply for electron tube circuits and similar applications, it is desirable to operate the oscillator at high power output. For supplying high power at good efficiency, the advantages of the so-called push-pull or double ended connection have long been recognized. However, provision must be made to avoid excessive inverse voltages on the transistor electrodes and to ensure operation within the current and forward voltage ratings of the transistors. A push-pull transistor oscillator having such features is disclosed and claimed in the co-pending U.S. patent application Serial No. 558,763 for "Push-Pull Transistor Oscillator" filed on Jauary 12, 1956 by James H. Guyton, and assigned to the assignee of the present invention. The oscillator of that application utilizes a pair of transistors having output circuits connected in push-pull fashion with the primary winding of the output transformer. The transformer includes a center-tapped or pair of feedback windings connected regeneratively with the input circuits to sustain oscillations and which operate to avoid excessive inverse voltages.

The oscillator of the last-mentioned patent application affords numerous advantages in circuit arrangement and performance. However, it has been found that equally good performance can be obtained by an improved circuit arrangement with the elimination of certain circuit components. Furthermore, the center-tapped feedback winding is eliminated and the attendant problems of obtaining balanced operation of the transistors are avoided.

Accordingly, an object of this invention is to provide an improved push-pull transistor oscillator of simple circuitry requiring few parts and which is adapted to furnish high power without exceeding the voltage and current ratings of the transistors.

A further object of this invention is to provide a push-pull transistor oscillator in which feedback for both transistors is obtained from a single inductive winding.

An additional object is to provide a transistor oscillator of the feedback type in which balanced operation of the transistors is ensured by avoidance of a center-tapped feedback winding.

Another object is to provide a push-pull transistor oscillator having a single series circuit between base electrodes forming the sole feedback path.

In the accomplishment of these objects there is provided a transistor oscillator circuit connected in push-pull in which a pair of transistors are alternately conductive through an output transformer primary winding. A single feedback winding on the transformer develops, during the non-conductive interval of each transistor, an input voltage to initiate the conductive interval of the other transistor. The feedback winding supplies a regenerative voltage and current to each transistor during the conductive interval thereof.

A more complete understanding of the invention may be had from the detailed description which follows taken with the accompanying drawings in which the single figure is a schematic circuit diagram of an illustrative embodiment of the inventive push-pull transistor oscillator. As illustrated, the oscillator may be employed suitably with a rectifier for developing a relatively high direct voltage from a low direct voltage source. In general, the oscillator comprises a pair of transistors 10 and 10', energized from a voltage source or battery 12, which supply alternating current to an output transformer 14. A rectifier circuit 16 is energized from the transformer 14.

The transistors 10 and 10' each include, respectively, an emitter electrode 18 and 18', collector electrode 20 and 20', and base electrode 22 and 22'. Both transistors in the illustrative embodiment are preferably of the junction type and are of the P–N–P configuration in which the emitter and collector electrodes are of P type material having holes as majority carriers and the base electrodes are of N type material having electrons as majority carriers. It will be apparent that the transistors may be either point contact or junction type and that an N–P–N configuration may be employed, if desired, with a suitable reversal of polarities.

The output circuits of the transistors 10 and 10' are connected in push-pull fashoin with the primary windings 24 and 26 of transformer 14 and the voltage source 12. The output circuit of transistor 10 extends from the emitter electrode 18, through conductor 28 and emitter circuit resistor 30, to the starting switch 32. From the switch 32 the circuit extends to the positive terminal of the voltage source or battery 12 and thence to a point of reference potential or ground 34. The output circuit of transistor 10 is completed through the primary winding 24 of output transformer 14 by connection from ground 36 to center-tap 38 and thence from terminal 40 to collector electrode 20. Similarly, the output circuit of transistor 10' extends from the emitter electrode 18' through conductor 42, emitter resistor 30, switch 32, and battery 12 to ground 34. The circuit is completed to the collector electrode 20' through primary winding 26 by connection from ground 36 to center-tap 38, and thence from terminal 44 to collector electrode 20'.

It is noted that the emitter to collector circuits of transistors 10 and 10' include a common path through the emitter resistor 30. The resistor 30 is of low value relative to the emitter resistance of the transistors 10 and 10' and introduces some degeneration in the emitter circuits for stability of the oscillator with temperature variations.

The input circuit of each transistor includes a feedback circuit which is energized from the output circuit of the other transistor and extends between the emitter and base electrodes. The emitter electrodes 18 and 18' of transistors 10 and 10' are connected together by conductors 28 and 42 and thence through resistor 30 to a common junction 46. A resistor 48 is connected between junction 46 and base electrode 22 and a resistor 50 is connected between junction 46 and base electrode 22'. The feedback circuit includes feedback winding 52 which is inductively coupled to primary windings 24 and 26 and connected by terminals 54 and 56 between base electrodes 22 and 22'. Preferably, a condenser 58 and a resistor 60 are serially connected with the feedback winding 52 to control the wave shape of the feedback current pulse. By this arrangement, a square wave output and maximum power may be obtained.

The resistors 48 and 50 in the input circuit of the transistors provide a low resistance path from the emitter to base electrodes which is effective to maintain the operation within the voltage and current ratings of the transistors as the transistor operating temperatures increase. An increase of collector current with temperature, other factors remaining constant, is inherent in transistors and may lead to thermal runaway and ultimate destruction of the transistor unless compensation is provided. The resistors 30, 48 and 50 provide degeneration in the input circuits which increases with the output circuit current to maintain a limiting value thereof.

The circuit arrangement for starting the oscillator includes a resistor 62 connected between base electrode 10' and ground connection 64. This completes a circuit from the positive terminal of battery 12, through switch 32, resistor 30, emitter electrode 18', base electrode 22' and resistor 62 to ground connection 64. The resistor 62 causes an initial unbalance of the voltages applied to the base electrodes 22 and 22'. Thus, the starting current supplied to the input circuit of transistor 10' predominates over that of transistor 10 upon closing switch 32.

The output of the oscillator is coupled by transformer 14 to the full-wave rectifier circuit 16. The rectifier circuit suitably comprises a dual diode 63 having plate electrodes 65 and 66 connected to the transformer secondary winding 68 at terminals 70 and 72, respectively. The secondary winding has a center-tap connected to ground 74. A buffer condenser 76 is connected across the secondary winding terminals 70 and 72. The cathode 78 is connected to the output circuit conductor 80 for application of the rectified output voltage to any desired utilization device. A filter condenser 82 and a load device, represented by resistor 84, are connected between conductor 80 and ground connections 86 and 88, respectively, In operation, the generation of oscillations is initiated by closing the starting switch 32. This completes the aforementioned starting circuit from the positive terminal of the battery 12 through the emitter and base electrodes of transistor 10', and resistor 62, to the negative terminal of the battery through the ground connections. This permits a small starting current to flow in the low impedance direction from emitter electrode 18' to base electrode 22' which permits an output current to flow from battery 12 through emitter electrode 18' to collector electrode 20' and thence through primary winding 26 to ground 36. This current in the output circuit of transistor 10' induces a voltage in feedback winding 52 by virtue of inductive coupling with primary windings 24 and 26. The relative polarity of the voltages across the primary winding 26 and feedback winding 52, at this instant of operation, are as indicated in the drawings. The induced feedback voltage causes the current to increase in the input circuit of transistor 10' causing further increase in the output circuit current. The circuit for the feedback current may be traced from the terminal 54 through condenser 58, resistors 48 and 30, emitter electrode 18', base electrode 22', resistor 60, and back to terminal 56 of the feedback winding 52. The feedback current wave form is determined largely by the series condenser 58 and resistors 48, 30, and 60. The output current reaches a maximum value, as determined by the circuit parameters, and the feedback voltage decreases to zero. The output circuit current through primary winding 26 decreases abruptly, terminating the conductive interval of the cycle for transistor 10'.

When the output circuit current in winding 26 decreases, the magnetic field of the transformer starts to collapse reversing the polarity of the voltage between the terminal 44 and tap 38. This tends to cause a high inverse voltage across the electrodes of transistor 10' during the non-conductive interval of the cycle of transistor 10'. However, the voltage across the feedback winding 52 is also reversed and thus the polarity thereof causes an input current to transistor 10 in the low impedance direction between emitter electrode 18 and base electrode 22. This current flow through the low impedance circuit including resistors 60, 50, and 30, and condenser 58 is effective to dissipate the energy stored in the magnetic field of transformer 14 and to thereby limit the inverse voltage on the electrodes of transistor 10' to a non-destructive value.

The current flow in the input circuit of transistor 10, during the non-conductive interval of transistor 10', initiates conduction in the output circuit of transistor 10 through the primary winding 24. As a result, a feedback voltage is induced in feedback winding 52 between terminals 54 and 56 which, at this instant of operation, is opposite the polarity indicated in the drawings. The conductive interval for the transistor 10 terminates with the collapse of the magnetic field of transformer 14, in the same manner as described with respect to transistor 10'. The second half-cycle of the oscillator is thus terminated. During the non-conductive interval of the transistor 10, the induced voltage in feedback winding 52 is reversed again, causing a current to flow in the input circuit of the transistor 10' in the low impedance direction between emitter electrode 18' and base electrode 22'. This current flow is effective to limit the inverse voltage developed across the electrodes of transistor 10. The second cycle of the oscillator is initiated by the input current to transistor 10' and the action just described is repetitive at a high rate to provide sustained oscillations in the primary winding of transformer 14.

The voltage induced in the secondary winding 68 is rectified in a known manner by the circuit 16. The output direct voltage appearing across output terminals 74 and 78 may be applied to any desired utilization device.

The advantages of employing the single inductive feedback winding 52 rather than a center-tapped arrangement will now be apparent. In a center-tapped winding it is difficult to locate the exact center point of the winding; furthermore, the inductive coupling of the two winding portions with the primary winding may not be exactly equal and as a result the circuit is not balanced. In the inventive circuit this difficulty is avoided and it is only necessary to make resistors 48 and 50 equal for balanced operation. Additionally, the inventive circuit permits considerable savings in the requirement of few components.

Although this description has been given with respect to a particular embodiment, it is not to be construed in a limiting sense upon the scope of the invention. Many variations and modifications within the spirit and scope of the invention will now occur to those skilled in the art. For a definition of the invention, reference is made to the appended claims.

We claim:

1. A transistor oscillator comprising first and second transistors each having emitter, collector, and base electrodes, an output transformer having a primary winding connected between the collector electrodes, a voltage source connected between the emitter electrodes and a center-tap on the primary winding, a feedback circuit including a feedback winding on the transformer inductively coupled with the primary winding and connected between the base electrodes, said feedback circuit also including a condenser in series connection and providing a common path between said base electrodes, and conductive means connected between the base and emitter electrode of each transistor.

2. A transistor oscillator comprising first and second transistors each having emitter, collector, and base electrodes, an output circuit including an output transformer having a primary winding connected between the collector electrodes, a voltage source connected between the emitter electrodes and a center-tap on the primary winding; a feedback circuit including in series connection a resistor, condenser, and feedback winding on the transformer inductively coupled to the primary winding, said series connection extending between the base electrodes and providing a common feedback path for the first and second transistors, and a resistor connected between the base and emitter electrodes of each transistor.

(References on following page)

References Cited in the file of this patent

UNITED STATES PATENTS

| | | |
|---|---|---|
| 2,506,158 | Mann et al. | May 2, 1950 |
| 2,540,275 | Mittleman | Feb. 6, 1951 |
| 2,748,274 | Pearlman | May 29, 1956 |
| 2,783,380 | Bonn | Feb. 26, 1957 |
| 2,788,493 | Zawels | Apr. 9, 1957 |
| 2,843,744 | Guyton | July 15, 1958 |

FOREIGN PATENTS

| | | |
|---|---|---|
| 728,024 | Great Britain | May 26, 1953 |